US012244265B2

(12) United States Patent
Rehder

(10) Patent No.: US 12,244,265 B2
(45) Date of Patent: Mar. 4, 2025

(54) WIRING FOR A RIGID PANEL SOLAR ARRAY

(71) Applicant: The Boeing Company, Chicago, IL (US)

(72) Inventor: Eric M. Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 15/938,791

(22) Filed: Mar. 28, 2018

(65) Prior Publication Data

US 2019/0305723 A1 Oct. 3, 2019

(51) Int. Cl.
*H02S 40/34* (2014.01)
*H01L 31/02* (2006.01)
(Continued)

(52) U.S. Cl.
CPC .......... *H02S 40/34* (2014.12); *H01L 31/0201* (2013.01); *H01L 31/02013* (2013.01); *H01L 31/042* (2013.01); *H01L 31/0508* (2013.01); *H01L 31/0512* (2013.01); *H02S 30/10* (2014.12); *H02S 10/40* (2014.12)

(58) Field of Classification Search
CPC .......... H02S 40/34; H02S 40/36; H02S 30/10; H01L 31/0201; H01L 31/02013; H01L 31/042; H01L 31/0508; H01L 31/0512
See application file for complete search history.

(56) References Cited

U.S. PATENT DOCUMENTS 3,376,164 A * 4/1968 Bachwansky ....... H01L 31/0508
174/262
3,833,426 A * 9/1974 Mesch ................ H01L 31/0508
136/244
(Continued)

FOREIGN PATENT DOCUMENTS

CN 103155158 A 6/2013
CN 203277428 U 11/2013
(Continued)

OTHER PUBLICATIONS

Non-Final Office Action dated Mar. 14, 2019 for U.S. Appl. No. 15/787,291.
(Continued)

*Primary Examiner* — Sadie White
(74) *Attorney, Agent, or Firm* — MH2 Technology Law Group LLP

(57) ABSTRACT

One or more solar cells are connected to a flex circuit, wherein: the flex circuit is comprised of a flexible substrate having one or more conducting layers for making electrical connections to the solar cells; the flex circuit is attached to a panel; and the solar cells are attached to the panel. The flex circuit can be attached to the panel so that the conducting layers are adjacent the solar cells, or the flex circuit can be attached to the panel so that the conducting layers run underneath the solar cells. The conducting layers can be deposited on the flexible substrate and/or the conducting layers can be embedded in the flex circuit, wherein the conducting layers are sandwiched between insulating layers of the flex circuit.

20 Claims, 9 Drawing Sheets

(51) Int. Cl.
  *H01L 31/042* (2014.01)
  *H01L 31/05* (2014.01)
  *H02S 10/40* (2014.01)
  *H02S 30/10* (2014.01)

(56) References Cited

U.S. PATENT DOCUMENTS

| | | | |
|---|---|---|---|
| 4,057,439 A * | 11/1977 | Lindmayer | H01L 31/0481 |
| | | | 136/251 |
| 4,257,821 A | 3/1981 | Kelly et al. | |
| 4,481,378 A | 11/1984 | Lesk | |
| 4,755,231 A | 7/1988 | Kurland et al. | |
| 5,330,583 A | 7/1994 | Asai et al. | |
| 5,567,248 A | 10/1996 | Chung | |
| 5,701,067 A | 12/1997 | Kaji et al. | |
| 5,855,692 A | 1/1999 | Kaji et al. | |
| 6,008,448 A | 12/1999 | Peck | |
| 6,034,322 A | 3/2000 | Pollard | |
| 6,156,967 A | 12/2000 | Ralph et al. | |
| 6,313,396 B1 * | 11/2001 | Glenn | H01L 31/0512 |
| | | | 136/251 |
| 6,350,944 B1 * | 2/2002 | Sherif | H01L 31/042 |
| | | | 136/244 |
| 6,441,297 B1 | 8/2002 | Keller et al. | |
| 6,543,725 B1 | 4/2003 | Meurer et al. | |
| 6,555,739 B2 | 4/2003 | Kawam | |
| 6,563,289 B1 | 5/2003 | Cross | |
| 6,637,702 B1 | 10/2003 | McCandless | |
| 8,814,099 B1 | 8/2014 | Harvey et al. | |
| 9,120,583 B1 | 9/2015 | Spence et al. | |
| 9,758,261 B1 | 9/2017 | Steinfeldt | |
| 2003/0057533 A1 | 3/2003 | Lemmi et al. | |
| 2004/0118446 A1 | 6/2004 | Toyomura | |
| 2005/0133079 A1 | 6/2005 | Boulanger et al. | |
| 2006/0170435 A1 | 8/2006 | Granicher et al. | |
| 2007/0005843 A1 | 1/2007 | Sim et al. | |
| 2007/0152194 A1 | 7/2007 | Natekar et al. | |
| 2008/0245405 A1 | 10/2008 | Garvison et al. | |
| 2008/0295889 A1 | 12/2008 | Schindler et al. | |
| 2009/0183760 A1 | 7/2009 | Meyer | |
| 2009/0255571 A1 * | 10/2009 | Xia | B32B 17/10018 |
| | | | 136/251 |
| 2009/0272436 A1 * | 11/2009 | Cheung | H01L 31/048 |
| | | | 136/259 |
| 2009/0288702 A1 | 11/2009 | Kim et al. | |
| 2010/0012172 A1 * | 1/2010 | Meakin | H01L 31/049 |
| | | | 136/251 |
| 2010/0089435 A1 | 4/2010 | Lockenhoff | |
| 2010/0126560 A1 * | 5/2010 | Lauvray | H01L 31/048 |
| | | | 977/773 |
| 2010/0186795 A1 | 7/2010 | Gaul | |
| 2010/0212741 A1 | 8/2010 | Lin | |
| 2010/0295383 A1 | 11/2010 | Cummings | |
| 2010/0313954 A1 | 12/2010 | Seel | |
| 2011/0041890 A1 | 2/2011 | Sheats | |
| 2011/0079263 A1 | 4/2011 | Avrutsky | |
| 2011/0168238 A1 * | 7/2011 | Metin | H01L 31/02013 |
| | | | 136/251 |
| 2011/0198444 A1 | 8/2011 | Dong | |
| 2011/0232748 A1 * | 9/2011 | Shimizu | H02S 40/34 |
| | | | 136/256 |
| 2012/0103388 A1 * | 5/2012 | Meakin | B32B 17/10018 |
| | | | 136/244 |
| 2012/0125391 A1 | 5/2012 | Pinarbasi et al. | |
| 2012/0161801 A1 | 6/2012 | Hasegawa | |
| 2012/0199176 A1 | 8/2012 | Hong et al. | |
| 2012/0313455 A1 | 12/2012 | Atham | |
| 2013/0014802 A1 | 1/2013 | Zimmerman | |
| 2013/0056047 A1 | 3/2013 | Beck et al. | |
| 2013/0263915 A1 | 10/2013 | Snidow | |
| 2014/0000682 A1 | 1/2014 | Zhao | |
| 2014/0033625 A1 | 2/2014 | Jenkins et al. | |
| 2014/0083497 A1 | 3/2014 | Ehrenfordt et al. | |
| 2014/0166067 A1 | 6/2014 | McGlynn et al. | |
| 2014/0255780 A1 | 9/2014 | Mikhaylik et al. | |
| 2014/0366927 A1 | 12/2014 | Lavrova et al. | |
| 2015/0083191 A1 | 3/2015 | Gmundner | |
| 2015/0096607 A1 | 4/2015 | Yong | |
| 2015/0263183 A1 | 9/2015 | Zimmermann et al. | |
| 2015/0287862 A1 * | 10/2015 | Pardell Vilella | H01L 31/0543 |
| | | | 136/246 |
| 2015/0318420 A1 | 11/2015 | Sewell et al. | |
| 2015/0349703 A1 | 12/2015 | Morad et al. | |
| 2016/0112004 A1 * | 4/2016 | Thiel | B32B 7/022 |
| | | | 136/246 |
| 2016/0126380 A1 | 5/2016 | Chang | |
| 2016/0194072 A1 * | 7/2016 | Cornew | H02S 20/30 |
| | | | 438/66 |
| 2016/0197207 A1 | 7/2016 | Morioka et al. | |
| 2016/0218665 A1 | 7/2016 | Crist | |
| 2016/0380221 A1 | 12/2016 | Gotanda et al. | |
| 2017/0015430 A1 * | 1/2017 | Pan | H02S 10/40 |
| 2017/0018670 A1 | 1/2017 | Bende et al. | |
| 2017/0040933 A1 | 2/2017 | Vogel | |
| 2017/0054406 A1 | 2/2017 | Narla et al. | |
| 2017/0098736 A1 | 4/2017 | Lee et al. | |
| 2017/0229692 A1 | 8/2017 | Thiel et al. | |
| 2017/0374737 A1 | 12/2017 | Jeong et al. | |
| 2018/0358491 A1 | 12/2018 | Rehder | |
| 2019/0127089 A1 | 5/2019 | Tomoda et al. | |
| 2019/0140584 A1 | 5/2019 | Hayashi et al. | |

FOREIGN PATENT DOCUMENTS

| | | |
|---|---|---|
| CN | 104241406 A | 12/2014 |
| CN | 104443439 | 3/2015 |
| CN | 104443439 A | 3/2015 |
| DE | 1013644 | 2/2003 |
| DE | 10136442 | 2/2003 |
| DE | 10136442 A1 | 2/2003 |
| EP | 1160876 | 12/2001 |
| EP | 1548847 | 6/2005 |
| EP | 3297042 | 3/2018 |
| JP | S51110985 A | 9/1976 |
| JP | 2001332753 A | 11/2001 |
| JP | 2002190612 | 7/2002 |
| JP | 2002190612 A | 7/2002 |
| JP | 2010-272725 | 12/2010 |
| JP | 2011071214 | 4/2011 |
| JP | 201692255 A | 5/2016 |

OTHER PUBLICATIONS

Non-Final Office Action dated Feb. 8, 2019 for Utility U.S. Appl. No. 15/643,274.
Non-Final Office Action dated Jul. 23, 2019 for U.S. Appl. No. 15/643,279.
Stern et al. "Modular solar panels using components engineered for producibility," 2011 37th IEEE Photovoltaic Specialists Conference, Seattle, WA, 2011, pp. 001626-001629.
http://www.fralock.com/aerospace/industrial-manufacturing-company/flexible-solar-array-back-panels-grounding-straps/.
https://news.lockheedmartin.com/news-releases?item=128302#assets_20295_128302-117.
Non-Final Office Action dated Jan. 28, 2019 for U.S. Appl. No. 15/643,289.
Final Office Action dated Jun. 6, 2019 for U.S. Appl. No. 15/643,282.
Non-Final Office Action dated Oct. 5, 2018 for U.S. Appl. No. 15/643,279.
Final Office Action dated Apr. 10, 2019 for U.S. Appl. No. 15/643,279.
Final Office Action dated Aug. 28, 2018 for U.S. Appl. No. 15/643,289.
Extended European Search Report dated Nov. 8, 2018 for EP Application No. 18176224.6.
Extended European Search Report dated Jul. 8, 2019 for European Patent Application No. 19162438.6.
Final Office Action dated Jul. 17, 2019 for U.S. Appl. No. 15/6787,291.
Non-Final Office Action dated Feb. 21, 2019 for U.S. Appl. No. 15/643,285.

(56) References Cited

OTHER PUBLICATIONS

Non-Final Office Action dated Mar. 14, 2019 for U.S. Appl. No. 15/787,304.
Final Office Action dated Aug. 6, 2019 for U.S. Appl. No. 15/643,289.
Extended European Search Report dated Nov. 12, 2018 for EP Application No. 18176222.0.
Final Office Action dated Jul. 12, 2019 for U.S. Appl. No. 15/643,285.
Final Office Action dated Jan. 15, 2019 for Utility U.S. Appl. No. 15/643,277.
Non-Final Office Action dated Feb. 5, 2019 for Utility U.S. Appl. No. 15/643,282.
Final Office Action dated Jul. 9, 2019 for U.S. Appl. No. 15/787,304.
Non-Final Office Action dated Jul. 30, 2018 for U.S. Appl. No. 15/643,277.
Non-Final Office Action dated Apr. 23, 2018 for U.S. Appl. No. 15/623,489.
European Communication dated Feb. 19, 2020 for EP Application No. 18176224.6.
Non-Final Office Action dated Sep. 27, 2019 for U.S. Appl. No. 15/643,287.
Final Office Action dated Oct. 10, 2019 for U.S. Appl. No. 15/643,277.
Non-Final Office Action dated Dec. 9, 2019 for U.S. Appl. No. 15/643,282.
Non-Final Office Action dated Jan. 8, 2020 for U.S. Appl. No. 15/787,304.
Non-Final Office Action dated Jan. 3, 2020 for U.S. Appl. No. 15/938,787.
Non-Final Office Action dated Nov. 9, 2020 for U.S. Appl. No. 15/643,282.
Final Office Action dated Sep. 2, 2020 for U.S. Appl. No. 15/643,274.
Non-Final Office Action dated Mar. 24, 2020 for U.S. Appl. No. 15/643,277.
Non-Final Office Action dated Mar. 31, 2020 for U.S. Appl. No. 15/643,274.
Non-Final Office Action dated Jan. 17, 2020 for U.S. Appl. No. 15/643,285.
Final Office Action dated Oct. 1, 2020 for U.S. Appl. No. 15/643,289.
European Examination Communication dated Dec. 1, 2020 for EP Application No. 17191162.1.
Non-Final Office Action dated Mar. 19, 2020 for U.S. Appl. No. 15/643,289.
Non-Final Office Action dated Jul. 28, 2020 for U.S. Appl. No. 15/643,279.
Final Office Action dated Jun. 15, 2020 for U.S. Appl. No. 15/787,291.
Final Office Action dated Jun. 8, 2020 for U.S. Appl. No. 15/643,285.
Final Office Action dated Feb. 6, 2020 for U.S. Appl. No. 15/643,287.
European Communication dated Aug. 13, 2020 for EP applicationNo. 19162441.0.
Final Office Action dated Feb. 6, 2020 for U.S. Appl. No. 15/643,279.
Final Office Action dated May 19, 2020 for U.S. Appl. No. 15/787,304.
Notice of Allowance dated Apr. 23, 2020 for U.S. Appl. No. 15/643,287.
Final Office Action dated Jul. 28, 2020 for U.S. Appl. No. 15/643,277.
Non-Final Office Action dated Feb. 4, 2020 for U.S. Appl. No. 15/787,291.
Final Office Action dated Apr. 10, 2020 for U.S. Appl. No. 15/643,282.
Final Office Action dated Jul. 10, 2020 for U.S. Appl. No. 15/938,787.
Final Office Action dated Apr. 22, 2021 for U.S. Appl. No. 15/643,285.
Non-Final Office Action dated Dec. 7, 2020 for U.S. Appl. No. 15/787,304.
Final Office Action dated Mar. 12, 2021 for U.S. Appl. No. 15/643,282.
Final Office Action dated Mar. 5, 2021 for U.S. Appl. No. 15/643,279.
Non-Final Office Action dated Feb. 1, 2021 for U.S. Appl. No. 15/643,277.
Non-Final Office Action dated Jan. 7, 2021 for U.S. Appl. No. 15/787,291.
Non-Final Office Action dated Dec. 22, 2020 for U.S. Appl. No. 15/643,285.
Final Office Action dated Dec. 28, 2021 for U.S. Appl. No. 15/643,282.
Non-Final Office Action dated Aug. 2, 2021 for U.S. Appl. No. 15/643,282.
Non-Final Office Action dated Sep. 15, 2022 for U.S. Appl. No. 16/543,279.
Non-Final Office Action dated Dec. 23, 2022 for U.S. Appl. No. 17/878,348.
Final Office Action dated Dec. 1, 2022 for U.S. Appl. No. 15/643,277.
Japanese Notice of Reasons for Rejection dated Mar. 7, 2023 for JP Application No. 2019-050650.
Final Office Action dated Jan. 20, 2022 for U.S. Appl. No. 15/643,285.
Non-Final Office Action dated Jul. 1, 2022 for U.S. Appl. No. 15/643,277.
Final Office Action dated Jun. 3, 2022 for U.S. Appl. No. 15/643,279.
Non-Final Office Action dated Sep. 29, 2021 for U.S. Appl. No. 15/643,289.
Non-Final Office Action dated Apr. 27, 2021 for U.S. Appl. No. 15/938,787.
Final Office Action dated Feb. 11, 2022 for U.S. Appl. No. 16/847,032.
Non-Final Office Action dated Sep. 23, 2022 for U.S. Appl. No. 16/991,589.
Non-Final Office Action dated Nov. 14, 2022 for U.S. Appl. No. 15/643,285.
Non-Final Office Action dated Mar. 14, 2022 for U.S. Appl. No. 15/643,282.
Final Office Action dated Jun. 1, 2021 for U.S. Appl. No. 15/643,277.
Final Office Action dated Feb. 6, 2023 for U.S. Appl. No. 17/100,823.
Non-Final Office Action dated Sep. 21, 2022 for U.S. Appl. No. 17/100,823.
Final Office Action dated Dec. 9, 2021 for U.S. Appl. No. 15/938,787.
Non-Final Office Action dated Dec. 20, 2022 for U.S. Appl. No. 15/643,282.
Final Office Action dated Aug. 25, 2022 for U.S. Appl. No. 15/643,282.
Final Office Action dated Feb. 14, 2022 for U.S. Appl. No. 16/847,359.
Notice of Allowance dated Jun. 23, 2022 for U.S. Appl. No. 16/847,359.
Final Office Action dated Feb. 24, 2022 for U.S. Appl. No. 15/643,277.
Final Office Action dated Dec. 17, 2021 for U.S. Appl. No. 15/787,291.
Non-Final Office Action dated Dec. 22, 2022 for U.S. Appl. No. 15/938,787.
Non-Final Office Action dated Sep. 17, 2021 for U.S. Appl. No. 15/643,277.
Non-Final Office Action dated Aug. 18, 2021 for U.S. Appl. No. 15/643,285.
Non-Final Office Action dated Aug. 18, 2021 for U.S. Appl. No. 15/787,291.
Non-Final Office Action dated Aug. 18, 2021 for U.S. Appl. No. 15/787,304.
Non-Final Office Action dated Dec. 6, 2021 for U.S. Appl. No. 15/643,279.
Notice of Allowance dated Apr. 20, 2022 for U.S. Appl. No. 15/643,289.
Non-Final Office Action dated May 12, 2021 for U.S. Appl. No. 15/643,274.
Final Office Action dated Dec. 15, 2021 for U.S. Appl. No. 15/787,304.
Final Office Action dated Jun. 27, 2023 for U.S. Appl. No. 15/643,282.
Final Office Action dated Mar. 31, 2023 for U.S. Appl. No. 15/643,279.
Non-Final Office Action dated Apr. 19, 2023 for U.S. Appl. No. 15/787,304.
Final Office Action dated Jun. 22, 2023 for U.S. Appl. No. 15/938,787.
Non-Final Office Action dated May 5, 2023 for U.S. Appl. No. 15/797,291.
Final office Action dated Jul. 7, 2023 for U.S. Appl. No. 17/878,348.
Non-Final Office Action dated May 11, 2023 for U.S. Appl. No. 15/643,277.
Final Office Action dated Apr. 18, 2023 for U.S. Appl. No. 16/991,589.
Final Office Action dated Jun. 15, 2023 for U.S. Appl. No. 15/643,285.

(56) References Cited

OTHER PUBLICATIONS

Japanese Notice of Reasons for Rejection (with English translation) dated Aug. 29, 2023 for Japanese Patent Application No. 2019-050650.
Non-Final Office Action dated Sep. 20, 2023 for U.S. Appl. No. 16/991,589.
Non-Final Office Action dated Aug. 4, 2023 for U.S. Appl. No. 17/100,823.
Non-Final Office Action dated Sep. 25, 2023 for U.S. Appl. No. 16/847,032.
Final Office Action dated Sep. 11, 2023 for U.S. Appl. No. 15/787,291.
Non-Final Office Action dated Sep. 13, 2023 for U.S. Appl. No. 15/643,279.
Non-Final Office Action dated Oct. 25, 2023 for U.S. Appl. No. 15/643,274.
Non-Final Office Action dated Oct. 26, 2023 for U.S. Appl. No. 17/878,348.
Non-Final Office Action dated Dec. 27, 2023 for U.S. Appl. No. 15/787,291.
Non-Final Office Action dated Nov. 9, 2023 for U.S. Appl. No. 15/643,282.
Final Office Action dated Jan. 9, 2024 for U.S. Appl. No. 17/100,823.
Final Office Action dated Mar. 4, 2024 for U.S. Appl. No. 15/643,279.
Notice of Allowance dated Jan. 24, 2024 for U.S. Appl. No. 16/847,032.
Final Office Action dated Nov. 15, 2023 for U.S. Appl. No. 15/643,277.
Non-Final Office Action dated Jan. 26, 2024 for U.S. Appl. No. 15/787,304.
Final Office Action dated Mar. 14, 2024 for U.S. Appl. No. 16/991,589.
Final Office Action dated Apr. 24, 2024 for U.S. Appl. No. 15/643,274.
Non-Final Office Action dated May 7, 2024 for U.S. Appl. No. 17/100,823.
Non-Final Office Action dated Jun. 18, 2024 for U.S. Appl. No. 15/643,279.
Final Office Action dated May 10, 2024 for U.S. Appl. No. 15/787,304.
Non-Final Office Action dated May 14, 2024 for U.S. Appl. No. 15/643,277.
Final Office Action dated Aug. 22, 2019 for U.S. Appl. No. 15/643,274.
Final Office Action dated May 23, 2024 for U.S. Appl. No. 15/643,282.
Final Office Action dated May 24, 2024 for U.S. Appl. No. 15/787,291.

* cited by examiner

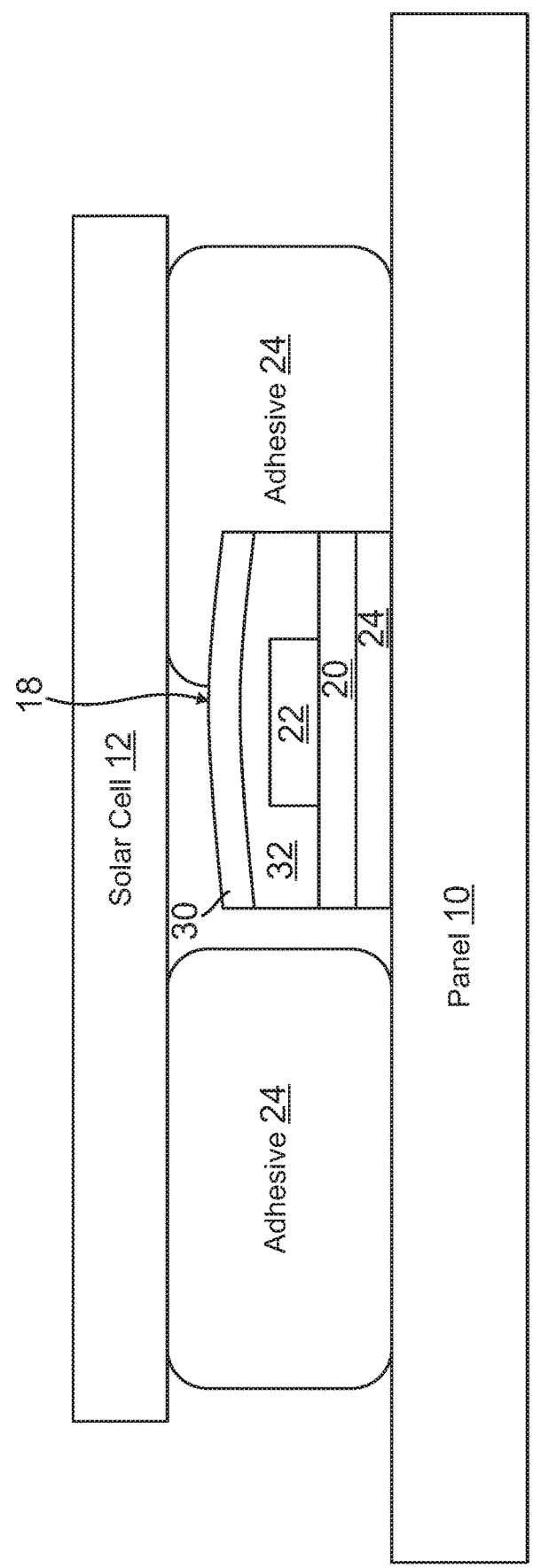

WIRING FOR A RIGID PANEL SOLAR ARRAY

CROSS REFERENCE TO RELATED APPLICATIONS

This application is related to the following commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS";

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY";

U.S. Utility application Ser. No. 15/643,279, filed on Jul. 6, 2017, by Eric Rehder, entitled "REWORK AND REPAIR OF COMPONENTS IN A SOLAR ARRAY";

U.S. Utility application Ser. No. 15/643,282, filed on Jul. 6, 2017, by Eric Rehder, entitled "POWER ROUTING MODULE FOR A SOLAR ARRAY";

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY";

U.S. Utility application Ser. No. 15/643,287, filed on Jul. 6, 2017, by Eric Rehder, entitled "NANO-METAL CONNECTIONS FOR A SOLAR CELL ARRAY"; and U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY";

all of which applications claim the benefit under 35 U.S.C. Section 119(e) of the following commonly-assigned provisional applications:

U.S. Provisional Application Ser. No. 62/394,636, filed on Sep. 14, 2016, by Eric Rehder, entitled "SOLAR CELL ARRAY CONNECTIONS";

U.S. Provisional Application Ser. No. 62/394,616, filed on Sep. 14, 2016, by Eric Rehder, entitled "CORNER CONNECTORS FOR A SOLAR CELL ARRAY";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY";

U.S. Provisional Application Ser. No. 62/394,627, filed on Sep. 14, 2016, by Eric Rehder, entitled "SELECT CURRENT PATHWAYS IN A SOLAR CELL ARRAY";

U.S. Provisional Application Ser. No. 62/394,629, filed on Sep. 14, 2016, by Eric Rehder, entitled "MULTI-LAYER CONDUCTORS IN A SOLAR CELL ARRAY";

U.S. Provisional Application Ser. No. 62/394,632, filed on Sep. 14, 2016, by Eric Rehder, entitled "REWORK AND REPAIR OF COMPONENTS IN A SOLAR CELL ARRAY";

U.S. Provisional Application Ser. No. 62/394,649, filed on Sep. 14, 2016, by Eric Rehder, entitled "POWER ROUTING MODULE FOR A SOLAR CELL ARRAY";

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY";

U.S. Provisional Application Ser. No. 62/394,667, filed on Sep. 14, 2016, by Eric Rehder, entitled "NANO-METAL CONNECTIONS FOR A SOLAR CELL ARRAY";

U.S. Provisional Application Ser. No. 62/394,671, filed on Sep. 14, 2016, by Eric Rehder, entitled "BACK CONTACTS FOR A SOLAR CELL ARRAY";

U.S. Provisional Application Ser. No. 62/394,641, filed on Sep. 14, 2016, by Eric Rehder, entitled "PRINTED CONDUCTORS IN A SOLAR CELL ARRAY"; and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY";

all of which applications are incorporated by reference herein.

This application also is related to the following commonly-assigned applications:

U.S. Utility application Ser. No. 15/787,291, filed on Oct. 18, 2017, by Eric Rehder, entitled "SOLAR CELL ARRAY WITH CHANGEABLE STRING LENGTH"; and U.S. Utility application Ser. No. 15/787,304, filed on Oct. 18, 2017, by Eric Rehder, entitled "SOLAR CELL ARRAY WITH BYPASSED SOLAR CELLS";

both of which applications claim the benefit under 35 U.S.C. Section 119(e) of commonly-assigned provisional applications:

U.S. Provisional Application Ser. No. 62/518,125, filed on Jun. 12, 2017, by Eric Rehder, entitled "SOLAR CELL ARRAY WITH CHANGEABLE STRING LENGTH"; and U.S. Provisional Application Ser. No. 62/518,131, filed on Jun. 12, 2017, by Eric Rehder, entitled "SOLAR CELL ARRAY WITH BYPASSED SOLAR CELLS";

all of which applications are incorporated by reference herein.

In addition, this application is related to the following commonly-assigned application:

U.S. Utility application Ser. No. 18/616,548, filed Mar. 26, 2024, by Eric Rehder, entitled "SINGLE SHEET FOLDOUT SOLAR ARRAY," which application is incorporated by reference herein.

BACKGROUND INFORMATION

1. Field

The disclosure is related generally to solar cell panels and more specifically to wiring for a rigid panel solar array.

2. Background

A solar array generally is comprised of multiple solar cells connected together to produce electric power. Wiring must be completed across the solar cells to carry power to other devices.

A spacecraft solar array is often based on rigid panels to provide a support structure for the solar cells in the array. Wiring of these panels requires extensive labor, which is expensive. Moreover, the wiring must be able to withstand the storage and deployment of the solar array during the launch of the spacecraft.

What is needed, then, is a means for simplifying the design, manufacturing, and testing of solar arrays that are based on rigid panels, including the wiring of these panels.

SUMMARY

To overcome the limitations in the prior art described above, and to overcome other limitations that will become apparent upon reading and understanding the present specification, the present disclosure describes one or more solar cells connected to a flex circuit, wherein: the flex circuit is comprised of a flexible substrate having one or more conducting layers for making electrical connections to the solar cells; the flex circuit is attached to a panel, such as a rigid panel; and the solar cells are attached to the panel.

In one aspect, the flex circuit can be attached to the panel so that the conducting layers are adjacent the solar cells. In another aspect, the flex circuit can be attached to the panel so that the conducting layers run underneath the solar cells. In addition to making electrical connections to the solar cells, the conducting layers can carry current off the flexible substrate.

The conducting layers can be deposited on the flexible substrate. The conducting layers also can be embedded in the flex circuit, wherein the conducting layers are sandwiched between insulating layers of the flex circuit.

DRAWINGS

Referring now to the drawings in which like reference numbers represent corresponding parts throughout:

FIG. 4 is a side view of a panel with a solar cell attached thereto, with a flex circuit underneath the solar cell on the panel.

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

This disclosure describes a flex circuit that provides the wiring for a rigid panel solar array. Wiring between the solar cells is embedded in or on the flex circuit, reducing the amount of labor involved in the design, manufacturing, and testing of the solar array. Moreover, the flex circuit is able to withstand the storage and deployment of the solar array.

The flex circuit can be configured as strips or webs that replace metal strips and wires manually placed between columns and/or rows of solar cells, as well as at the end of a string of solar cells to carry current to other devices. The flex circuit allows use of existing panels for mounting the solar array, but enables more flexibility for routing power along strings and between columns and/or rows of solar cells.

Figure 1A:
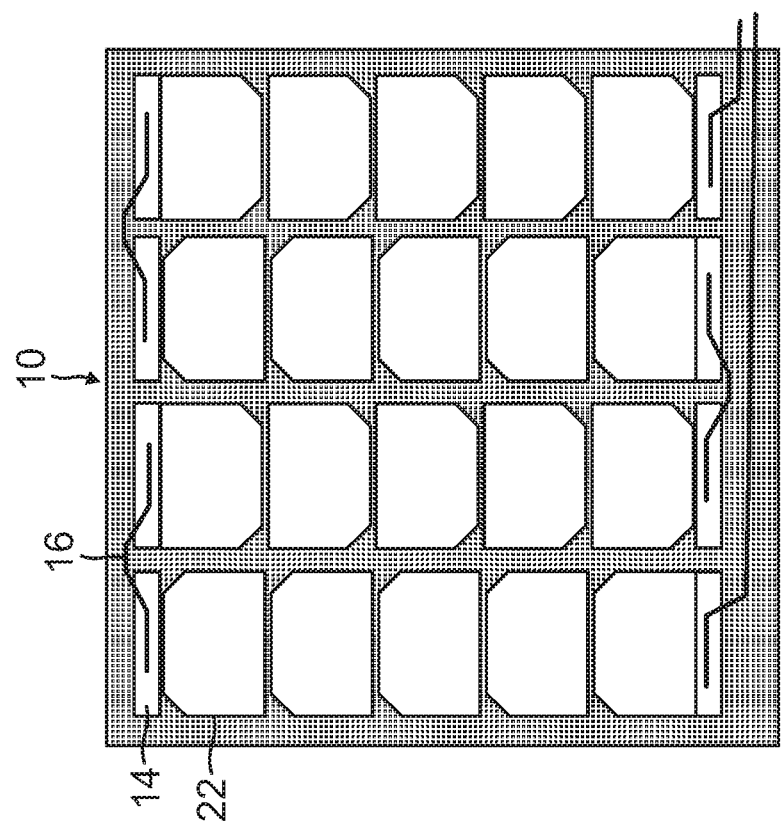
FIGS. 1A and 1B illustrate typical layouts for a rigid panel with one or more solar cells mounted thereon.
Figure 1B:
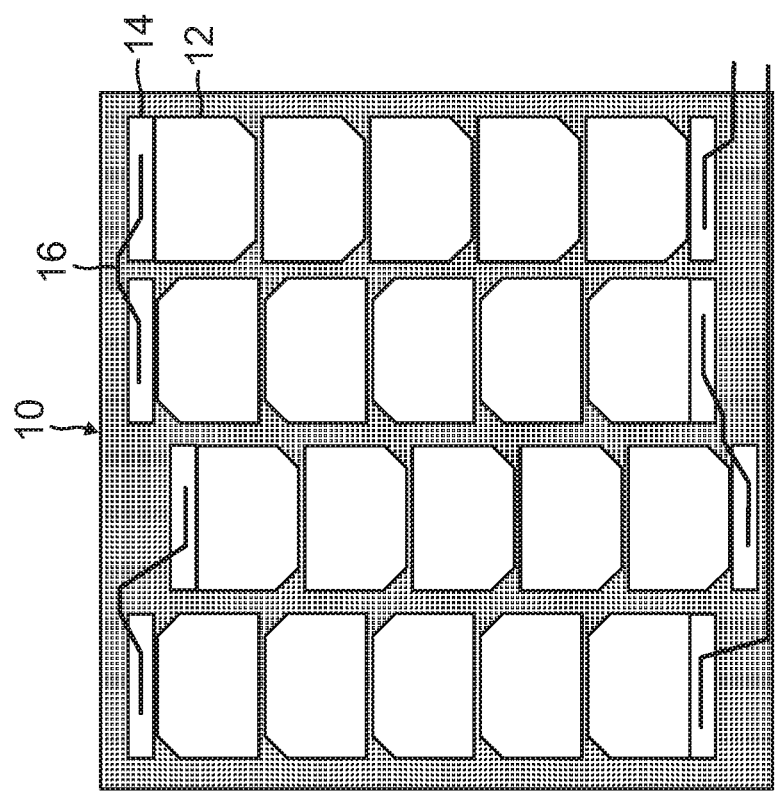

FIGS. 1A and 1B illustrate typical layouts for a panel 10 that is rigid with one or more solar cells 12 mounted thereon. The solar cells 12 are series-connected in a line, e.g., from top to bottom in each column of solar cells 12. Each column of solar cells 12 terminates in a metal strip 14 at the top and/or bottom of the column, and multiple columns are connected together at the top and/or bottom of each column with a wire 16.

Alternatively, the solar cells 12 can be series-connected in a line, e.g., from left to right in each row of solar cells 12. Similarly, each row of solar cells 12 can be terminated in a metal strip 14 at the left and/or right of the row, and multiple rows can be connected together at the left and/or right of each row with a wire 16.

Each solar cell 12 contributes roughly 2V and a linear series creates 2V times the number of solar cells 12. If the power system needs 100V, then 50 solar cells 12 are needed in series.

In one example, the columns and rows of solar cells 12 are aligned, as shown in FIG. 1A. In another example, due to a variety of panel 10 layout restrictions, there are often offsets in the columns and/or rows, resulting in the panel 10's offset layout shown in FIG. 1B.

Figure 2C:
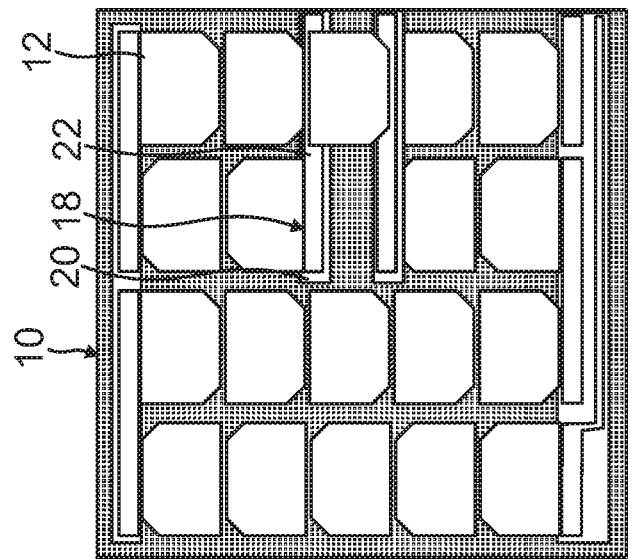
FIGS. 2A, 2B and 2C illustrate examples where metal strips and wires for connecting the solar cells are replaced with strips of flex circuits that are applied to the rigid panel.
Figure 2B:
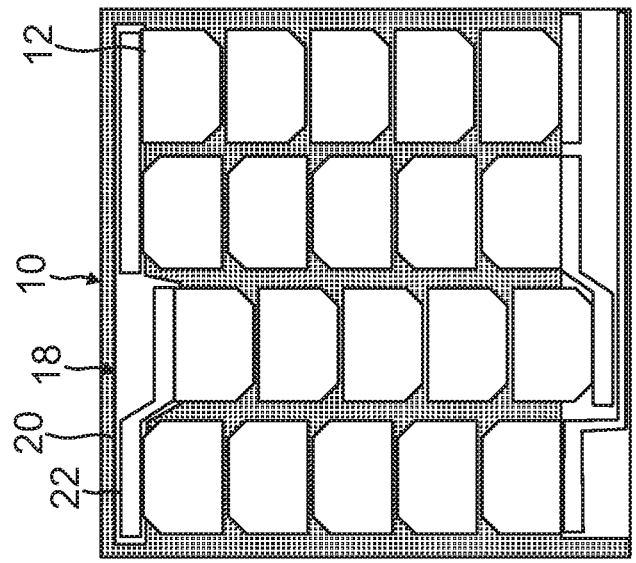
Figure 2A:
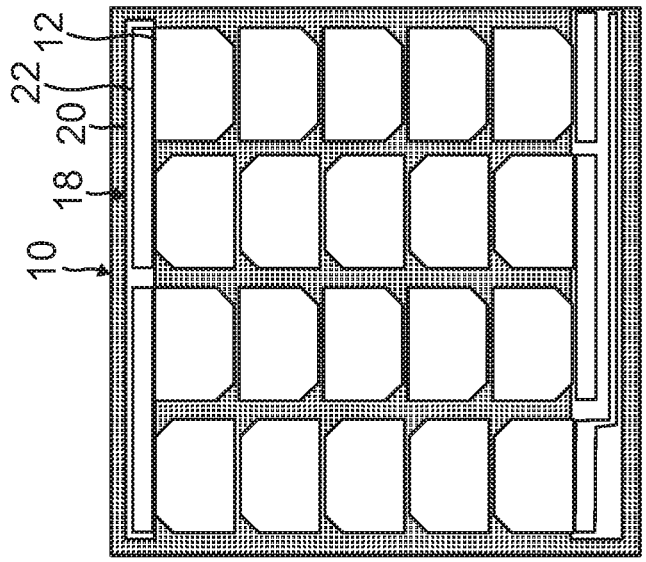

FIGS. 2A, 2B and 2C illustrate examples where the metal strips 14 and wires 16 are replaced with strips of flex circuits 18 that are applied to the panel 10.

The flex circuit 18 comprises a flexible substrate 20 having at least one conducting layer 22. The conducting layer 22 is patterned to provide embedded conductors or wiring for making electrical connections with the solar cells 12. The conducting layer 22 can be encapsulated in insulating polymer with localized openings for electrical connections.

These strips of flex circuits 18 can replace the metal strips 14 or wires 16 between columns of the solar cells 12 shown in FIGS. 1A and 1B. In other cases, the flex circuit 18 can replace the wiring at the end of a series-connected string of solar cells 12 that transports current off the panel 10 to the other devices.

FIGS. 2A and 2B are similar to the layouts shown in FIGS. 1A and 1B, but using the strips of flex circuit 18 in place of the metal strips 14 and wires 16. FIG. 2C illustrates a layout where the series connection of the solar cells 12 ends in the middle of a column, and the strips of flex circuit 18 connect to the solar cells 12 in another column or off the panel 10 to the other devices.

In most instances, the flex circuits 18 can be positioned along the edges of or in between the solar cells 12. In some instances, the flex circuit 18 can be positioned underneath the solar cells 12. Preferably, the flex circuits 18 are used not only to connect the solar cells, but also to carry the currents to the perimeter of the panel 10 for transport off the panel 10 to the other devices.

Figure 3:
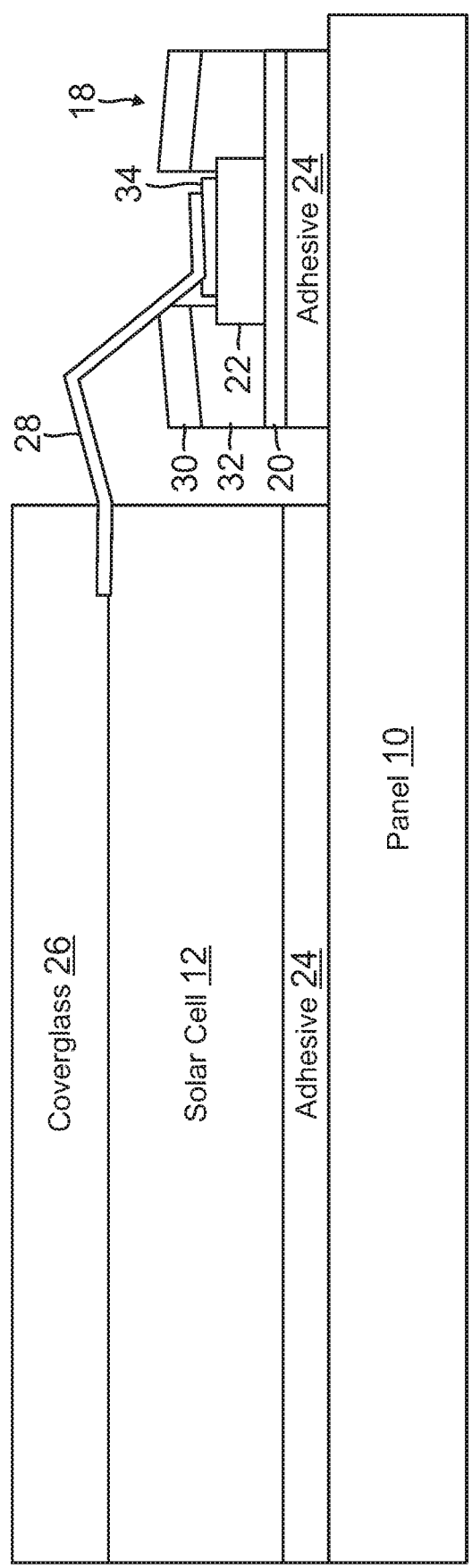
FIG. 3 is a side view of a panel with a solar cell attached thereto, with a flex circuit positioned next to the solar cell on the panel.

FIG. 3 is a side view of a panel 10 with a solar cell 12 attached thereto by an adhesive layer 24, with a coverglass 26 on top of the solar cell 12. A metal foil interconnect 28 electrically connects the solar cell 12 to a flex circuit 18 positioned next to the solar cell 12 on the panel 10. The flex circuit 18 is also attached to the panel 10 by the adhesive layer 24, and comprises at least the flexible substrate 20, the conducting layer 22, an insulating layer 30, and an adhesive 32 between the flexible substrate 20 and the insulating layer 30. Additional metallization 34 can be deposited on the conducting layer 22 where the metal foil interconnect 28 is attached.

In this example, the flexible substrate 20 is polyimide or another polymer, the conducting layer 22 is copper (Cu) or another metal or alloy, and the conducting layer 22 is sandwiched between two insulating layers, namely, the flexible substrate 20 and the insulating layer 30 laminated on top of the conducting layer 22 by the adhesive 32. In other examples, the flex circuit 18 can have more than one conducting layer 22 in a laminate structure, with each of the conducting layers 22 sandwiched between two insulating layers, such as the insulating layer 30 and an additional insulating layer 30 or two additional insulating layers 30, such that each of the conducting layers 22 provides embedded conductors for making electrical connections with the solar cells 12.

FIG. 4 is a side view of a panel 10 with a solar cell 12 attached thereto by adhesive layer 24, with the flex circuit 18 underneath the solar cell 12. In this example, the conducting layer 22 of the flex circuit 18 is fully encapsulated by the flexible substrate 20, insulating layer 30 and adhesive 32.

The adhesive layer 24 attaching the solar cell 12 to the panel 10 should be at least as thick as the flex circuit 18. Thus, thinner flex circuits 18 are desired to enable thinner adhesive layer 24 bonding of the solar cell 12 to the panel 10. Thinner flex circuits 18 and thinner adhesive layer 24 also provide for less mass as well as higher heat transfer. However, as the conducting layer 22 of the flex circuit 18 become thinner, it will also need to be wider to have the same conductivity.

Many adhesives 32 that can be considered to bond the insulating layer 30 to the flexible substrate 20 of the flex circuit 18 have moderate outgassing during and after curing. This outgassing can lead to bubble formation and result in failures of the flex circuit 18.

Narrow flex circuits 18 will more easily allow outgassing products to escape and not form bubbles. However, thin but wide conducting layers 22 will thus be at risk of bubble formation. A flex circuit 18 less than 2 cm wide is likely safe from bubble formation when used with an adhesive 32. The flex circuit 18 would need to be greater than 0.1 mm to have sufficient conductivity to carry the solar cell 12 currents.

The flex circuit 18 can also be used to electrically connect adjacent solar cells 12, and other components, such as bypass diodes. The flex circuit 18 can also be integrated with string termination wiring. This is of particular value with the cropped corner connection approach described in the cross-referenced applications set forth above.

In the cropped corner connection approach, solar cells 12 can have their top and bottom electrical connections extending into cropped corner regions defined by cropped corners of the solar cells 12. A convenient approach is to have the cropped corners of adjacent solar cells 12 aligned. These electrical connections extending into cropped corner regions are then attached to conducting layers 22 on or in the flex circuit 18. The flex circuit 18 is then able to route the current to other solar cells 12 and off the panel 10 to other devices.

Figure 5C:
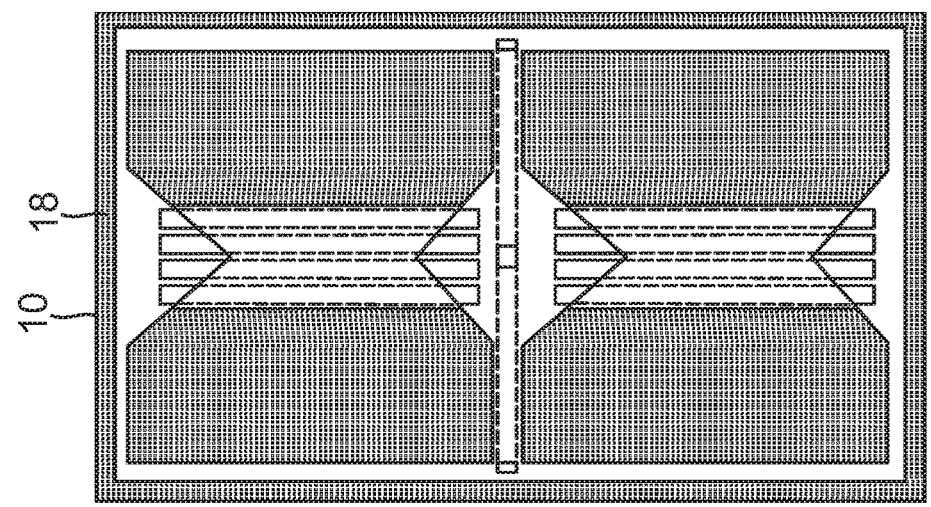
FIGS. 5A, 5B and 5C illustrates an assembly using the rigid panel and flex circuit.
Figure 5B:
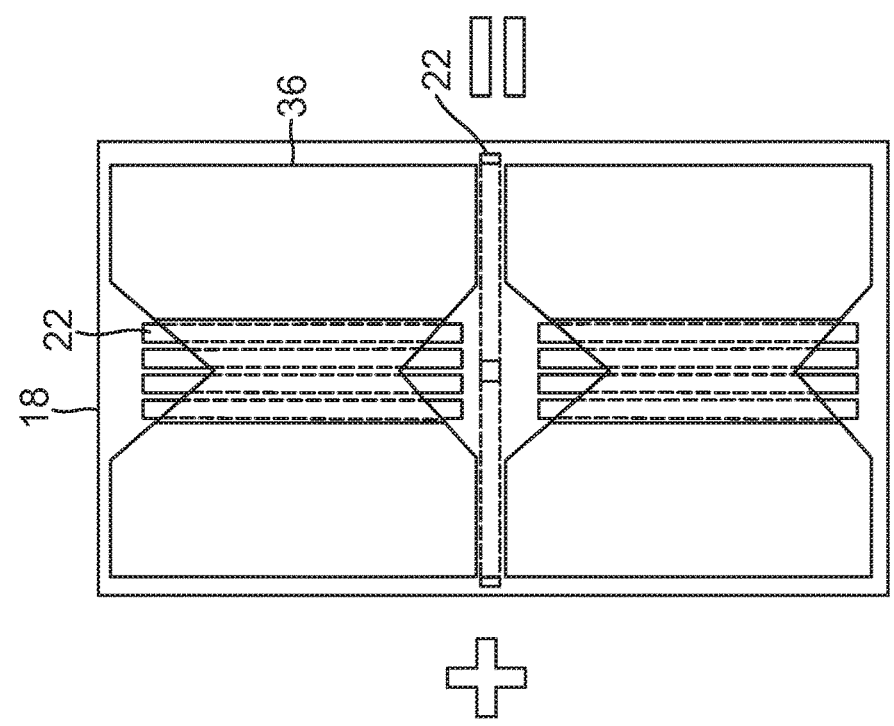
Figure 5A:
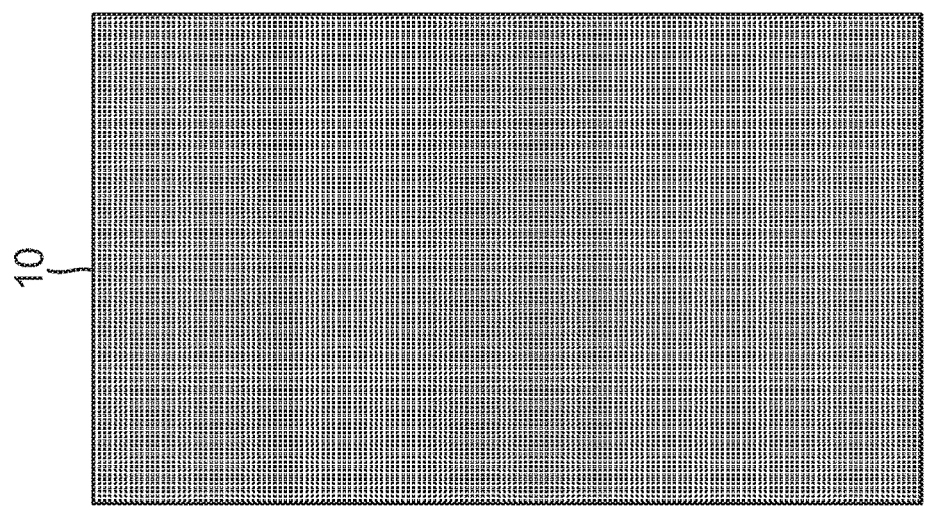

FIGS. 5A, 5B and 5C illustrates an assembly using the panel 10 and flex circuit 18. FIG. 5A is a panel 10 that is rigid having a honeycomb structure, FIG. 5B is a flex circuit 18 having a web structure with cutouts 36, and FIG. 5C shows the flex circuit 18 applied to the panel 10. In this example, the flex circuit 18 has conducting layers 22 running up and down the flex circuit 18, as well as left and right across the flex circuit 18.

Figure 6C:
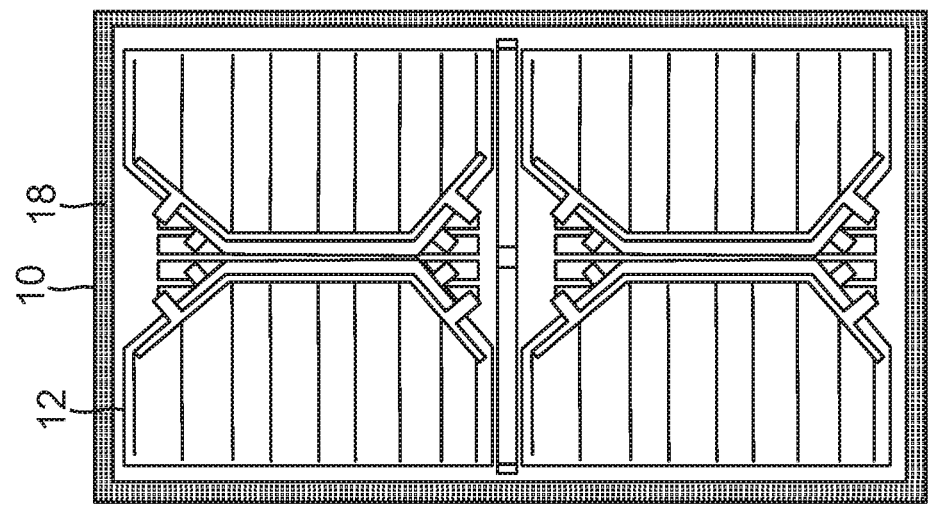
FIGS. 6A, 6B and 6C illustrate how solar cells are applied to the assembly using the rigid panel and flex circuit.
Figure 6B:
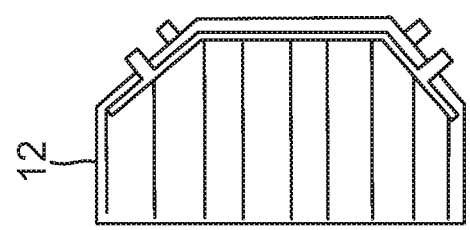
Figure 6A:
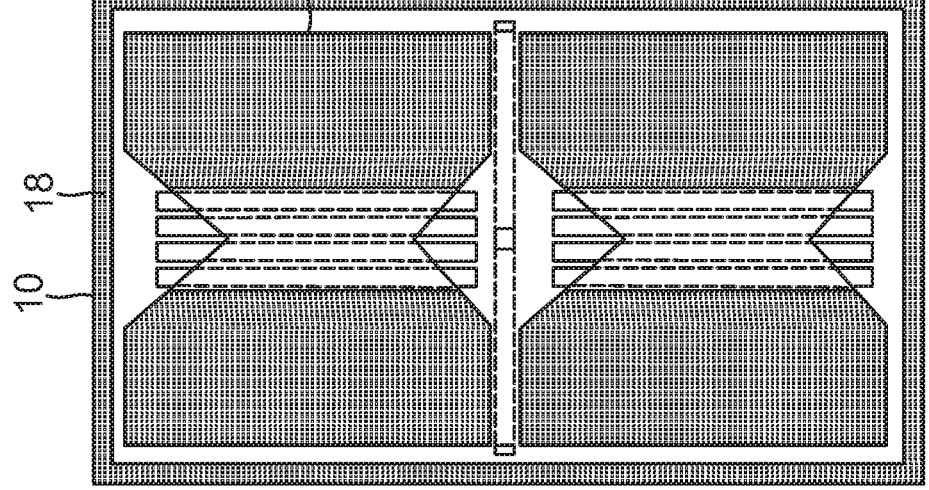

FIGS. 6A, 6B and 6C illustrate how solar cells 12 are applied to the assembly using the panel 10 and flex circuit 18. FIG. 6A is the same as FIG. 5C and shows the flex circuit 18 applied to the panel 10. FIG. 6B shows a typical solar cell 12. FIG. 6C shows four of the solar cells 12 of FIG. 6B applied to the assembly of FIG. 6A, wherein the four solar cells 12 are attached to the panel 10 in the cutouts 36 of the flex circuit 18, wherein interconnects electrically connect the solar cells 12 to the conducting layers 22 in the flex circuit 18.

Other examples can use elements other than a panel 10 that is rigid with a honeycomb structure. For example, the panel 10 can comprise a fiberglass panel or a rigid perimeter frame with a mesh inside the frame with the solar cells 12 mounted on the mesh. This mesh would provide mechanical support to the solar cells 12 while having low mass, wherein the mesh could be made from a wide variety of metals, polymers, or carbon fiber. However, the same approach of using a flex circuit 18 to replace wiring is equally relevant to solar cells 12 mounted on mesh or fiberglass. This is true for solar cells 12 mounted on any surface where electrical connections using foil elements, wiring, or other conductors can be replaced with a flex circuit 18.

Figure 7:
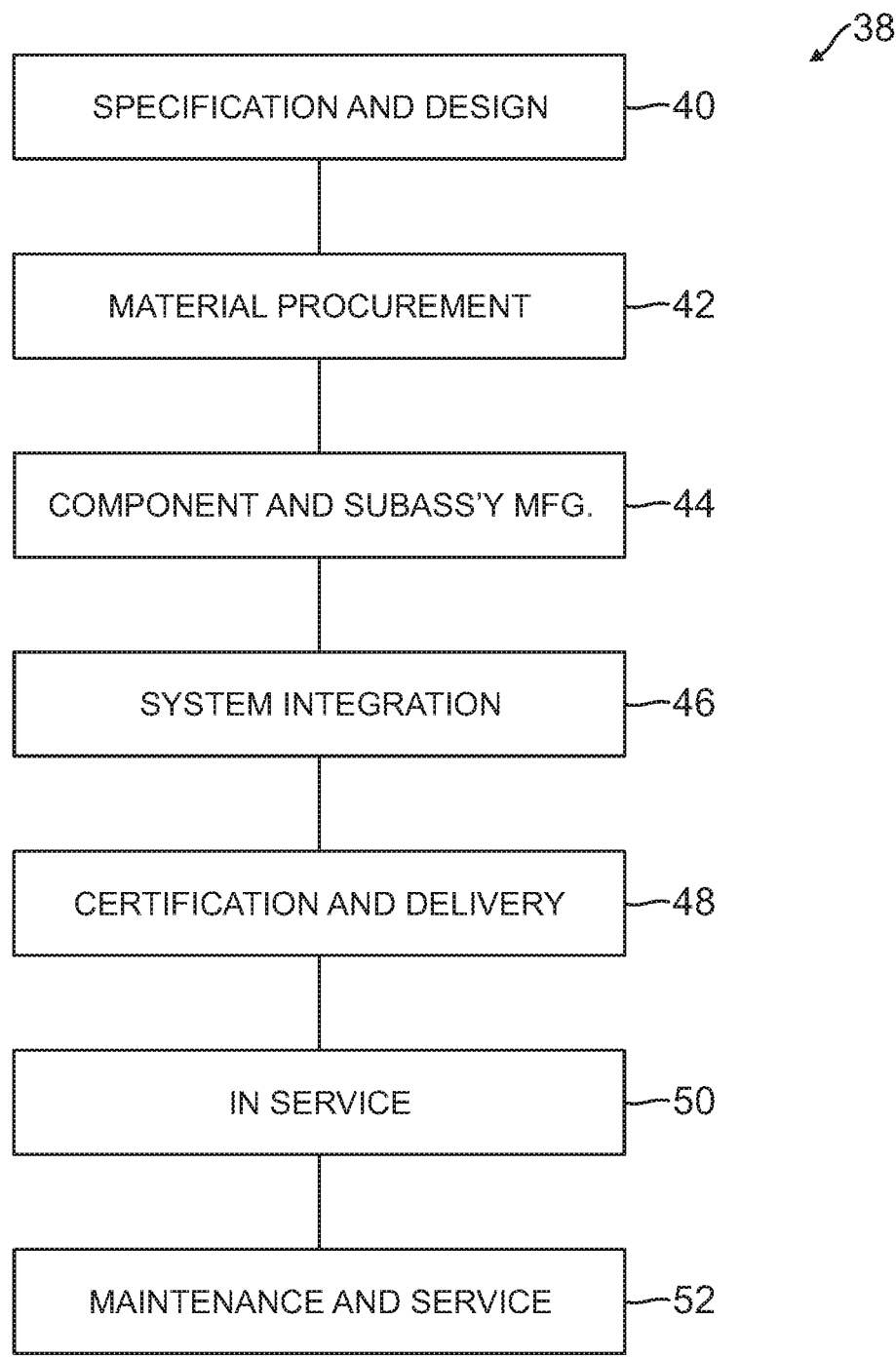
FIG. 7 illustrates a method of fabricating a rigid panel with a flex circuit and solar cells for a satellite.
Figure 8:
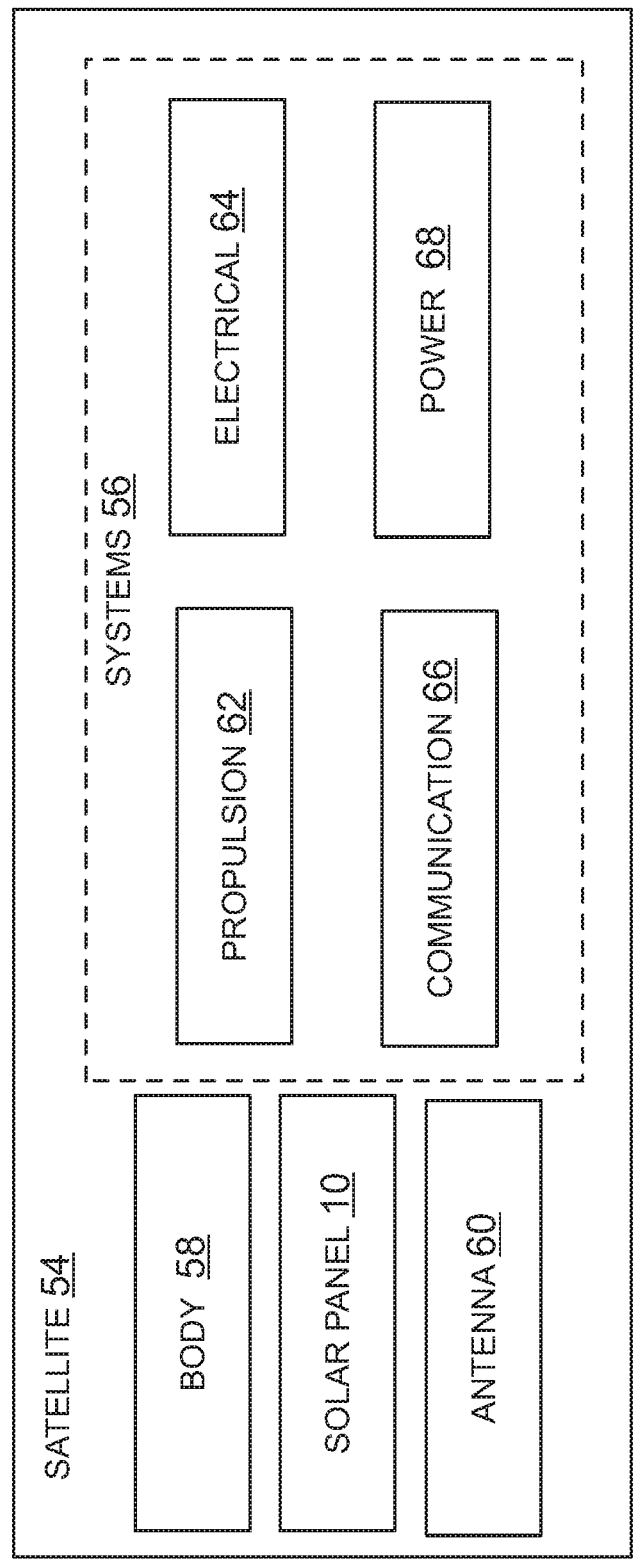
FIG. 8 illustrates the satellite having a rigid panel with a flex circuit and solar cells resulting from the method shown in FIG. 7.

Examples of the disclosure may be described in the context of a method 38 of fabricating an apparatus comprising a panel 10 with one or more solar cells 12 thereon for a satellite, the method 38 comprising steps 40-52, as shown in FIG. 7, wherein the resulting satellite 54 having a panel 10 with one or more solar cells 12 thereon is shown in FIG. 8.

As illustrated in FIG. 7, during pre-production, exemplary method 38 may include specification and design 40 of the panel 10 and/or satellite 54, and material procurement 42 for same. During production, component and subassembly manufacturing 44 and system integration 46 of the panel 10 and/or satellite 54 takes place, which include fabricating the panel 10 and/or satellite 54. Thereafter, the panel 10 and/or satellite 54 may go through certification and delivery 48 in order to be placed in service 50. The panel 10 and/or satellite 54 may also be scheduled for maintenance and service 52 (which includes modification, reconfiguration, refurbishment, and so on), before being launched.

Each of the processes of method 38 may be performed or carried out by a system integrator, a third party, and/or an operator (e.g., a customer). For the purposes of this description, a system integrator can include without limitation any number of solar cell, panel, satellite or spacecraft manufacturers and major-system subcontractors; a third party may include without limitation any number of venders, subcontractors, and suppliers; and an operator may be a satellite company, military entity, service organization, and so on.

As shown in FIG. 8, a satellite 54 fabricated by exemplary method 38 can include systems 56, a body 58, one or more panels 10 with one or more solar cells 12 thereon, and one or more antennae 60. Examples of the systems 56 included with the satellite 54 include, but are not limited to, one or more of a propulsion system 62, an electrical system 64, a communications system 66, and a power system 68. Any number of other systems 56 also can be included.

Figure 9:
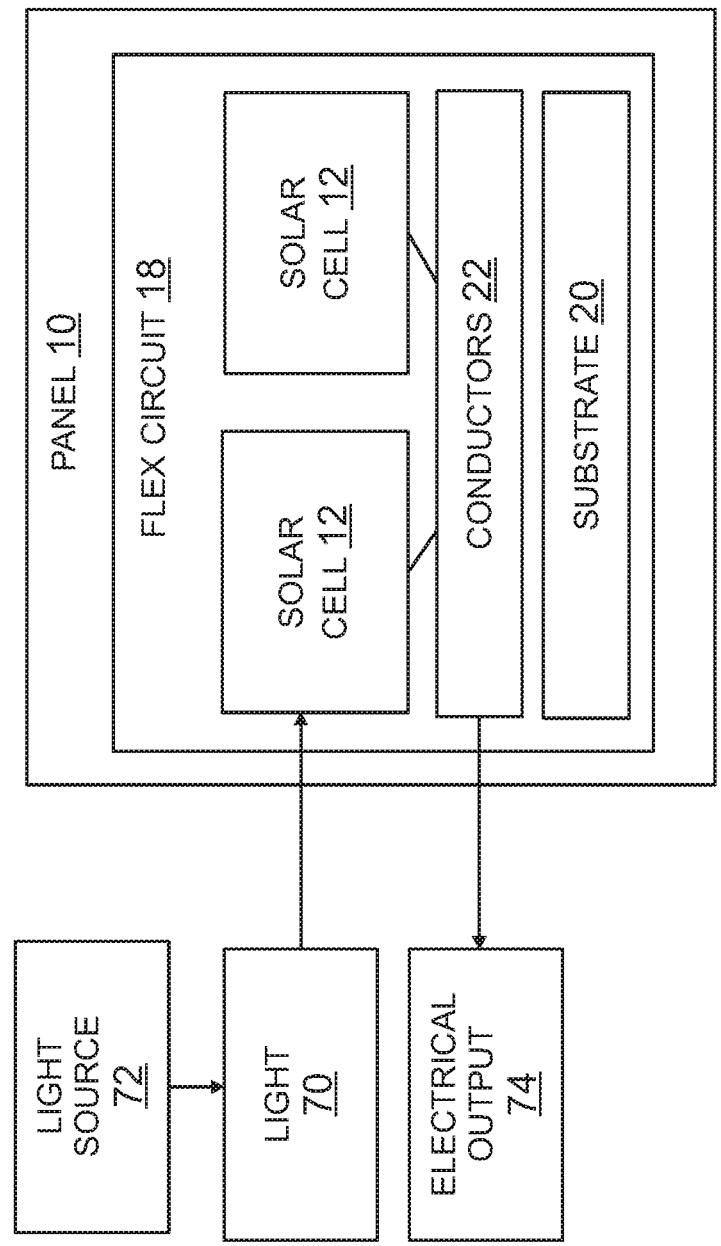
FIG. 9 is an illustration of the rigid panel with the flex circuit and solar cells in the form of a functional block diagram.

FIG. 9 is an illustration of a method of deploying and operating the panel 10 with one or more solar cells 12 thereon, in the form of a functional block diagram, according to one example. The panel 10 is comprised of one or more of the solar cells 12 individually connected to the flex circuit 18, wherein the flex circuit 18 is comprised of the flexible substrate 20 having one or more conducting layers 22 for making electrical connections to the solar cells 12. Each of the solar cells 12 absorbs light 70 from a light source 72 and generates an electrical output 74 in response thereto.

The description of the examples set forth above has been presented for purposes of illustration and description, and is not intended to be exhaustive or limited to the examples described. Many alternatives, modifications and variations may be used in place of the specific elements described above.

What is claimed is:

1. An apparatus, comprising:
a panel for mounting solar cells thereon, wherein the panel is a rigid panel; and
a flex circuit applied to the rigid panel and electrically connected to the solar cells using one or more interconnects, wherein:
the flex circuit is comprised of a flexible substrate having one or more conducting layers deposited on the flexible substrate and one or more insulating layers laminated on top of the one or more conducting layers by an adhesive in a laminate structure,
the one or more conducting layers are sandwiched between the flexible substrate and the one or more insulating layers of the flex circuit in the laminate structure,
the one or more conducting layers are patterned to provide embedded conductors in the laminate structure for making electrical connections to the solar cells,
the flex circuit has a web structure with cutouts for mounting the solar cells on the rigid panel,
the solar cells are aligned and mounted on the rigid panel in the cutouts of the web structure so that cropped corners of the solar cells define a corner region, and
the one or more interconnects electrically connect the solar cells to the one or more conducting layers in the flex circuit in the corner region defined by cropped corners of the solar cells.

2. The apparatus of claim 1, wherein the flex circuit is attached to the panel so that the flex circuit is positioned along edges of or in between the solar cells and the one or more conducting layers are adjacent the solar cells.

3. The apparatus of claim 1, wherein the flex circuit is attached to the panel so that the flex circuit is positioned underneath the solar cells and the one or more conducting layers run underneath the solar cells.

4. The apparatus of claim 1, wherein the one or more conducting layers carry current off the flexible substrate.

5. The apparatus of claim 1, wherein the panel has a honeycomb structure.

6. The apparatus of claim 1, wherein the panel is a fiberglass panel.

7. The apparatus of claim 1, wherein the panel is a frame with mesh inside the frame.

8. A method, comprising:
applying a flex circuit to a panel used for mounting solar cells thereon, wherein the panel is a rigid panel; and
electrically connecting the flex circuit to the solar cells using one or more interconnects, wherein:
the flex circuit is comprised of a flexible substrate having one or more conducting layers deposited on the flexible substrate and one or more insulating layers laminated on top of the one or more conducting layers by an adhesive in a laminate structure,
the one or more conducting layers are sandwiched between the flexible substrate and the one or more insulating layers of the flex circuit in the laminate structure,
the one or more conducting layers are patterned to provide embedded conductors in the laminate structure for making electrical connections to the solar cells,
the flex circuit has a web structure with cutouts for mounting the solar cells on the rigid panel,
the solar cells are aligned and mounted on the rigid panel in the cutouts of the web structure so that cropped corners of the solar cells define a corner region, and
the one or more interconnects electrically connect the solar cells to the one or more conducting layers in the flex circuit in the corner region defined by the cropped corners of the solar cells.

9. The method of claim 8, wherein the flex circuit is attached to the panel so that the flex circuit is positioned along edges of or in between the solar cells and the one or more conducting layers are adjacent the solar cells.

10. The method of claim 8, wherein the flex circuit is attached to the panel so that the flex circuit is positioned underneath the solar cells and the one or more conducting layers run underneath the solar cells.

11. The method of claim 8, wherein the one or more conducting layers carry current off the flexible substrate.

12. The method of claim 8, wherein the panel has a honeycomb structure.

13. A method, comprising:
deploying a rigid panel with one or more solar cells mounted thereon connected to a flex circuit using one or more interconnects, wherein:
the flex circuit is comprised of a flexible substrate having one or more conducting layers deposited on the flexible substrate and one or more insulating layers laminated on top of the one or more conducting layers by an adhesive in a laminate structure,
the one or more conducting layers are sandwiched between the flexible substrate and the one or more insulating layers of the flex circuit in the laminate structure,
the one or more conducting layers are patterned to provide embedded conductors in the laminate structure for making electrical connections to the solar cells,
the flex circuit has a web structure with cutouts for mounting the solar cells on the rigid panel,
the solar cells are aligned and mounted on the rigid panel in the cutouts of the web structure so that cropped corners of the solar cells define a corner region, and
the one or more interconnects electrically connect the solar cells to the one or more conducting layers in the flex circuit in the corner region defined by the cropped corners of the solar cells.

14. The apparatus of claim 1, wherein the one or more conducting layers are encapsulated in insulating polymer by the one or more insulating layers with localized openings for the electrical connections.

15. The method of claim 8, wherein the one or more conducting layers are encapsulated in insulating polymer by the one or more insulating layers with localized openings for the electrical connections.

16. The method of claim 8, wherein the panel is a fiberglass panel.

17. The method of claim 8, wherein the panel is a frame with mesh inside the frame.

18. The method of claim 13, wherein the flex circuit is attached to the panel so that the flex circuit is positioned along edges of or in between the solar cells and the one or more conducting layers are adjacent the solar cells.

19. The method of claim 13, wherein the flex circuit is attached to the panel so that the flex circuit is positioned underneath the solar cells and the one or more conducting layers run underneath the solar cells.

20. The method of claim 13, wherein the one or more conducting layers carry current off the flexible substrate.

* * * * *